United States Patent
Hoffmann et al.

(10) Patent No.: US 11,946,293 B2
(45) Date of Patent: Apr. 2, 2024

(54) DOOR UNLOCKING AND/OR DOOR OPENING MECHANISM COMPRISING AN ACTUATING DEVICE

(71) Applicant: WITTE Automotive GmbH, Velbert (DE)

(72) Inventors: Andreas Hoffmann, Wülfrath (DE); Markus Herdering, Bochum (DE); Patrick Schlosser, Essen (DE); Ralf Höhn, Velbert (DE)

(73) Assignee: Witte Automotive GmbH, Velbert (DE)

( * ) Notice: Subject to any disclaimer, the term of this patent is extended or adjusted under 35 U.S.C. 154(b) by 188 days.

(21) Appl. No.: 16/860,103

(22) Filed: Apr. 28, 2020

(65) Prior Publication Data
US 2020/0347650 A1 Nov. 5, 2020

(30) Foreign Application Priority Data

May 2, 2019 (DE) ...................... 10 2019 206 282.2

(51) Int. Cl.
*E05B 81/76* (2014.01)
*G01D 11/24* (2006.01)
*H03K 17/96* (2006.01)

(52) U.S. Cl.
CPC ............ *E05B 81/77* (2013.01); *G01D 11/245* (2013.01); *H03K 17/962* (2013.01); *E05B 81/76* (2013.01)

(58) Field of Classification Search
CPC .......... E05B 81/77; E05B 81/76; E05B 81/78; H01H 9/0214; H01H 13/06; H03K 17/962;
(Continued)

(56) References Cited

U.S. PATENT DOCUMENTS 5,730,165 A * 3/1998 Philipp .............. G01R 27/2605
  324/677
6,344,791 B1 * 2/2002 Armstrong ......... G05G 9/04737
  338/114

(Continued)

FOREIGN PATENT DOCUMENTS

CN 104136697 A 11/2014
CN 107849865 A 3/2018
(Continued)

OTHER PUBLICATIONS

Merriam-Webster.com Dictionary, s.v. "surround," accessed Jul. 20, 2022, https://www.merriam-webster.com/dictionary/surround. (Year: 2022).*

(Continued)

*Primary Examiner* — Christine M Mills
*Assistant Examiner* — Emily G. Brown
(74) *Attorney, Agent, or Firm* — Marshall & Melhorn, LLC

(57) ABSTRACT

A door unlocking and/or door opening mechanism may have an actuating device that may have at least one actuating element, a housing, and at least one detection unit. The detection unit may have a sensor, a trigger element and an evaluation unit. The detection unit may be arranged in the housing. The actuating element may be arranged for an actuation outside the housing and in a region that is accessible from the outside. The trigger element may be arranged at a distance from the sensor in a locked state of the door unlocking and/or door opening mechanism. When the actuating element is actuated in the direction of the housing, to the actuating element deforms the trigger element. The sensor detects a change in the distance between the trigger element and the sensor.

15 Claims, 3 Drawing Sheets

Figure 1:
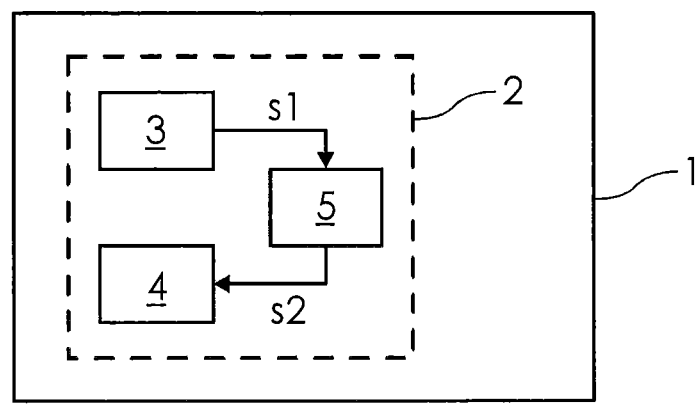

(58) Field of Classification Search
CPC ........ H03K 17/96; B60R 25/20; B60R 25/21;
B60R 25/22; B60R 25/225; B60R 25/23;
G05G 1/02
USPC .............................. 200/293; 340/5.72, 5.62
See application file for complete search history.

(56) References Cited

U.S. PATENT DOCUMENTS

| | | | | |
|---|---|---|---|---|
| 6,429,782 | B2* | 8/2002 | Pavatich | H03K 17/962 |
| | | | | 361/181 |
| 7,091,433 | B2* | 8/2006 | Meagher | H01H 13/06 |
| | | | | 200/61.45 M |
| 7,244,897 | B2* | 7/2007 | Villagrasa | H01H 13/06 |
| | | | | 200/302.1 |
| 7,763,819 | B2* | 7/2010 | Ieda | H01H 13/52 |
| | | | | 200/600 |
| 8,502,099 | B2* | 8/2013 | Lin | H01H 1/64 |
| | | | | 200/302.2 |
| 8,575,506 | B2* | 11/2013 | Kitahara | H01H 13/06 |
| | | | | 200/341 |
| 8,766,124 | B2* | 7/2014 | Alvarez | H01H 13/82 |
| | | | | 200/515 |
| 8,836,486 | B2* | 9/2014 | Saito | H01H 1/64 |
| | | | | 200/302.2 |
| 9,353,557 | B2* | 5/2016 | Sanborn | E05B 85/14 |
| 9,366,059 | B2* | 6/2016 | Müller | E05B 65/108 |
| 9,447,604 | B2* | 9/2016 | Witte | E05B 7/00 |
| 9,696,839 | B1* | 7/2017 | Bingle | G06F 3/04883 |
| 9,786,449 | B2* | 10/2017 | Dinh | H01H 13/88 |
| 9,995,065 | B2* | 6/2018 | Witte | E05B 85/16 |
| 10,697,839 | B2* | 6/2020 | Neel | H03K 17/955 |
| 2003/0029210 | A1* | 2/2003 | Budzynski | E05B 85/10 |
| | | | | 70/264 |
| 2004/0026222 | A1* | 2/2004 | Adachi | H01H 13/702 |
| | | | | 200/512 |
| 2008/0018611 | A1* | 1/2008 | Serban | H03K 17/975 |
| | | | | 345/173 |
| 2011/0308925 | A1* | 12/2011 | Kitahara | H01H 13/06 |
| | | | | 200/302.2 |
| 2012/0167642 | A1 | 7/2012 | Savant et al. | |
| 2014/0367975 | A1* | 12/2014 | Sanborn | H03K 17/962 |
| | | | | 292/336.3 |
| 2016/0211094 | A1* | 7/2016 | Fuchs | E05B 81/76 |
| 2017/0016255 | A1 | 1/2017 | Guibbert et al. | |
| 2018/0209182 | A1 | 7/2018 | Beck et al. | |
| 2019/0017302 | A1* | 1/2019 | Beck | E05B 1/0015 |
| 2019/0152433 | A1* | 5/2019 | Cumbo | G07C 9/00714 |
| 2021/0108450 | A1* | 4/2021 | Savant | E05B 81/56 |
| 2021/0246694 | A1* | 8/2021 | Spick | H03K 17/97 |
| 2021/0317689 | A1* | 10/2021 | Spick | B25J 13/087 |

FOREIGN PATENT DOCUMENTS

| | | | | |
|---|---|---|---|---|
| CN | 109649329 A | 4/2019 | | |
| CN | 109681053 A | 4/2019 | | |
| DE | 10212768 A1 * | 6/2003 | ............. | E05B 81/78 |
| DE | 102014107809 A1 | 12/2015 | | |
| DE | 102016122550 A1 | 5/2018 | | |
| DE | 102017112790 A1 | 12/2018 | | |
| DE | 102018111007 A1 * | 1/2019 | | |
| DE | 102018111007 A1 | 1/2019 | | |
| DE | 102017120393 A1 | 3/2019 | | |
| EP | 1763048 A1 | 6/2005 | | |
| EP | 2088267 A2 | 8/2009 | | |
| WO | WO-2018162108 A1 * | 9/2018 | ............. | E05B 77/34 |

OTHER PUBLICATIONS

Espacenet, Machine translation of DE 102018111007 A1, generated 11 Sep. 2022 (Year: 2022).*
Espacenet, Machine translation of WO 2018162108 A1, generated Nov. 10, 2022 (Year: 2022).*
Espacenet machine translation of WO 2018162108 A1, generated Apr. 25, 2023 (Year: 2023).*
Espacenet machine translation of De 1020181110007 A1, generated Nov. 9, 2022 (Year: 2022).*
Espacenet, machine generated translation of WO 2018/162108 A1 (description), generated Apr. 25, 2023. (Year: 2023).*
The State Intellectual Property Office of People's Republic of China, Office Action in Application CN202010331621.3, dated Apr. 14, 2021, 10 pages.
European Patent Office, Extended European Search Report in Application No. 1EP 20 171 843.4, dated Sep. 15, 2020, 8 pages.
German Patent and Trademark Office, Office Action in Application No. 10 2019 206 282.2, dated Nov. 11, 2019, 7 pages. Munich, Germany.

* cited by examiner

DOOR UNLOCKING AND/OR DOOR OPENING MECHANISM COMPRISING AN ACTUATING DEVICE

The invention relates to a door unlocking and/or door opening mechanism comprising an actuating device.

Door unlocking and/or door opening mechanisms are known, for example, in motor vehicles in which a vehicle lock of a vehicle door is unlocked electrically.

For example, DE 10 2014 107 809 A1 discloses a door handle, in particular an outside door handle of a motor vehicle, having a sensor comprising a first metal surface arranged in the interior of the door handle and a second metal surface arranged at a distance from said first metal surface, which second metal surface can be bent in the direction of the first metal surface, and a detection apparatus by means of which a change in capacitance or inductance caused by the change in the distance between the metal surfaces can be detected.

Further access systems for a vehicle are known, for example, from DE 10 2017 120 393 A1, DE 10 2016 122 550 A1 or US 2018/0209182 A1.

The object of the invention is to provide a door unlocking and/or door opening mechanism which is improved compared with the prior art, in particular for an electric vehicle lock, comprising an actuating device.

According to the invention, the object is achieved with a door unlocking and/or door opening mechanism which has the features of claim 1.

Advantageous embodiments of the invention are the subject of the dependent claims.

According to the invention, a door unlocking and/or door opening mechanism is provided with an actuating device which comprises at least one actuating element, a housing and a detection unit having at least one sensor, at least one trigger element and an evaluation unit, the detection unit being arranged in the housing. In a locked state of the door unlocking and/or door opening mechanism, the trigger element arranged within the housing is arranged at a distance from the sensor, the sensor detecting a change in a distance between the trigger element and the sensor. In particular, the sensor generates a signal when the trigger element moves into a detection range of the sensor due to the change in distance. The sensor here acts as a fixed electrode, in particular a measuring electrode, and the trigger element acts as a movable electrode, in particular a reference electrode. The evaluation unit evaluates the sensor signal and transmits an opening signal to the door unlocking and/or door opening mechanism if the said unit identifies a reduction in distance between the trigger element and the sensor on the basis of the change in distance detected by the sensor.

The actuating device designed in this way allows a compact design which requires less installation space than conventional actuating devices. Due to the arrangement of the detection unit within the housing, it is not necessary to open the housing, for example for switch actuation, as with known actuation devices. The housing is thus sealed against external influences. Furthermore, the door unlocking and/or door opening mechanism allows a switchless operating unit for the electrical opening of a door, so that wear on the actuating device is reduced compared with switch-based actuating devices.

According to one embodiment, the trigger element is designed to be elastically deformable. In particular, the trigger element is a metal sheet, for example a sheet metal tongue or sheet metal tab. The trigger element can thus be elastically deformed under the action of force, in particular when the actuating element is actuated. The elastic deformation results in a change in distance, which is detected by the sensor. The change in distance between the trigger element and the sensor can also comprise a change in distance between the trigger element and the sensor in some regions. In other words: the trigger element is deformed in the direction of the sensor only in a certain region, so that a distance changes only between this region of the trigger element and the sensor. Alternatively, the trigger element can also be made of a non-metal, elastically deformable material.

According to a further embodiment, the housing is a one-piece plastics material housing. This allows the housing to be optimally sealed against external influences. The detection unit arranged within the housing is thus protected. Due to the switchless design of the actuating device, it is not necessary to open the housing.

For example, the housing has a housing side, in particular a housing wall, which covers the trigger element and is designed to be elastically deformable. This allows a force transmission from the housing to the trigger element when the actuating element is actuated. For example, a wall thickness of this housing side is smaller than that of other housing sides, so that an elasticity of the housing is increased in this region. Alternatively or additionally, the plastics material in this region can also be provided with an elastic material which is either covalently integrated in the plastics material or interacts externally with the plastics material. Furthermore, the elastic housing side can also consist of a material that is different from the rest of the housing, so that the housing is not made of one piece, but of two or several pieces.

According to a further embodiment, the actuating element is arranged on the elastic housing side. This allows a force transmission in the actuating direction from the actuating element to the housing and thus to the trigger element. The actuating element has a high-quality plastics material surface, in particular in an actuating region, as a result of which surface the actuating element has mechanical stability, corrosion protection and an attractive appearance.

According to a further embodiment, the sensor is a capacitive sensor, so that the change in distance between the sensor and the trigger element is detected by means of a change in capacitance between the trigger element and the sensor, which in this case form a plate capacitor. The sensor generates a sensor signal for evaluation depending on a change in capacitance. Furthermore, the trigger element can be connected to an electrical zero potential, for example, and can be coupled to the evaluation unit in an electrically switchable manner. This allows a temporally alternating evaluation of a capacitance detected between the trigger element and the sensor and an evaluation of a by means of a capacitance of the trigger element compared with the electrical zero potential. The latter is used in particular to detect the approach of an object, in particular a user's hand, to the actuating element.

In an alternative embodiment, the sensor is an inductive sensor, in particular a so-called inductance to digital converter (LDC) sensor. In this case, the change in distance is detected due to a frequency shift of a resonant circuit of the sensor which results from the change in distance between the trigger element and the sensor. For this purpose, the sensor comprises an oscillator which uses a resonant circuit to generate an alternating electromagnetic field which emerges from an active surface of the sensor. Such an inductive sensor allows a particularly high sensitivity, whereby the frequency shift of the resonant circuit can be easily detected.

In particular, the detection unit is based on the so-called Metal over Cap (MoC) technology, in which the sensor is shielded from external influences. In this case, a hand or a finger of a user in the detection range of the sensor is replaced by the trigger element. This also allows micromovements to be sensed. In addition, the detection unit is robust against vibrations and temperature-resistant.

To automatically reset the actuating element to an initial position, in particular to a non-actuating position, at least one reset element can be arranged between the actuating element and the housing. According to one embodiment, the reset element is a closed-pore foam, e.g. a soft foam made of polyurethane. In this case, the reset element is characterized by good compressibility, which allows a quick and low-wear reset of the actuating element.

Furthermore, the door unlocking and/or door opening mechanism comprises a door lock and a control unit. For example, the door unlocking and/or door opening mechanism has the following functions:

the evaluation unit of the actuating device transmits an opening signal to the control unit when the evaluation unit uses the position detected by the sensor to identify a change in distance, in particular a reduction in distance, between the trigger element and the sensor, and the control unit of the door unlocking and/or door opening mechanism generates a control signal on the basis of the opening signal and transmits said control signal to the door lock for unlocking the door lock.

With the door unlocking and/or door opening mechanism designed in this way, a trigger threshold for transmitting the opening signal can be individually defined. The door unlocking and/or door opening mechanism can thus be individually adapted to the wishes and/or specifications of a manufacturer.

The door unlocking and/or door opening mechanism is provided in particular for a vehicle door, which is, for example, a vehicle side door and/or a vehicle tailgate.

According to a further embodiment, the actuating device can be arranged in the region of an outside door handle. For example, the actuating device is arranged on an exterior side of the outside door handle or on a side of the outside door handle that faces the vehicle.

Alternatively, the actuating device can be arranged in an engagement recess provided in the vehicle shell. The engagement recess can be arranged in any region of the vehicle shell. For example, the engagement recess is arranged in a region of a vehicle shell of the vehicle door which faces the outside door handle. Due to the small installation space requirement of the actuating device, an arrangement position of the actuating device in the vehicle door can be individually adapted to the wishes and/or specifications of a manufacturer.

Figure 2:
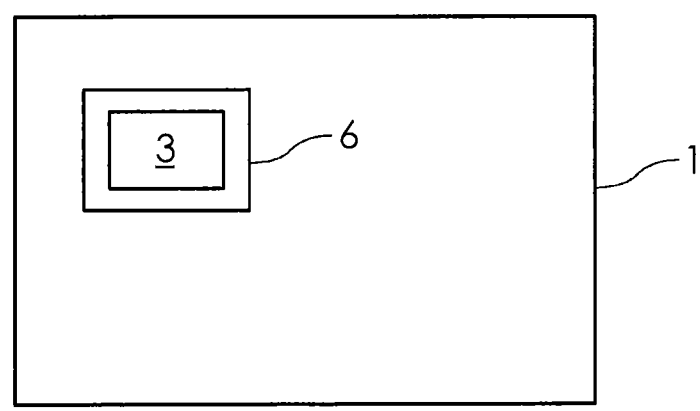
Figure 3:
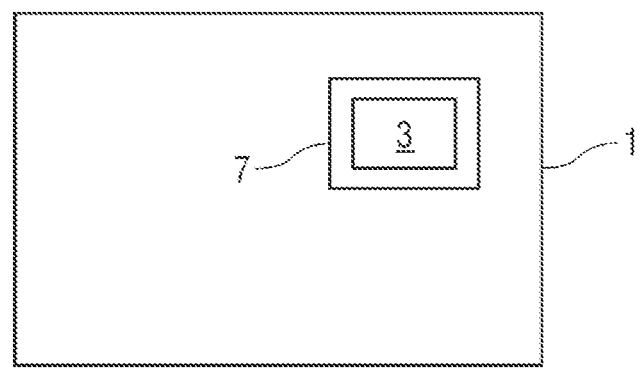
Figure 4:
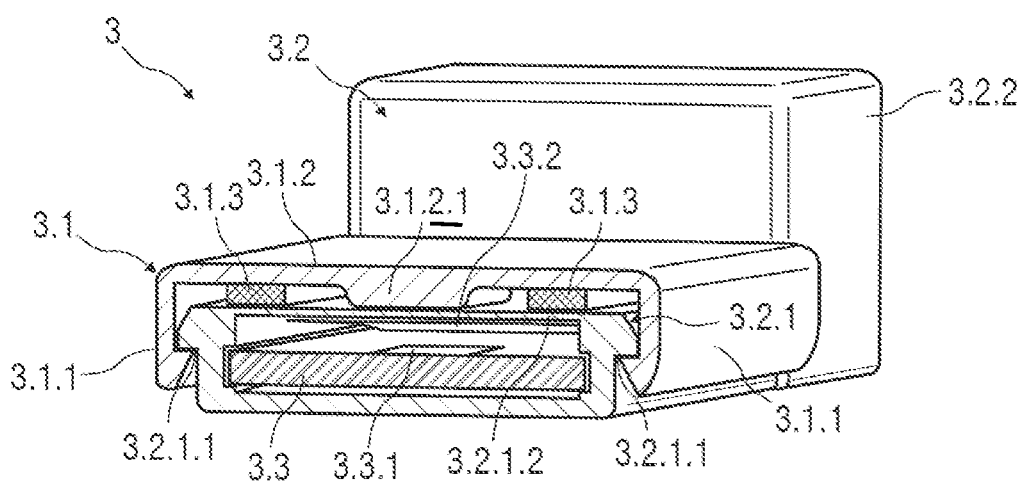
Figure 5:
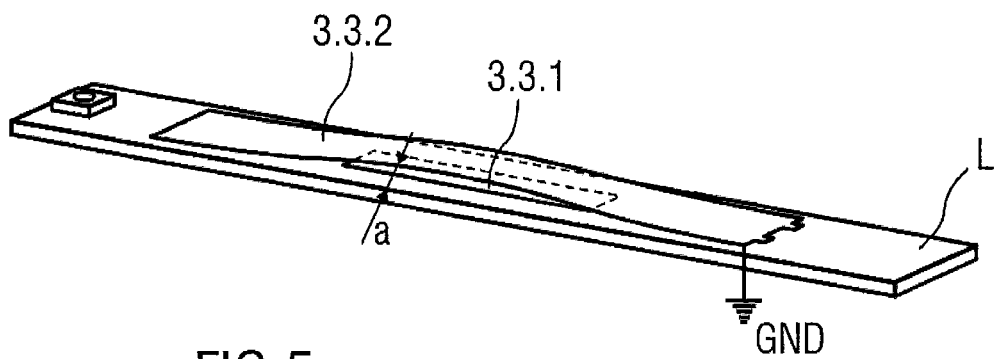
Figure 6:
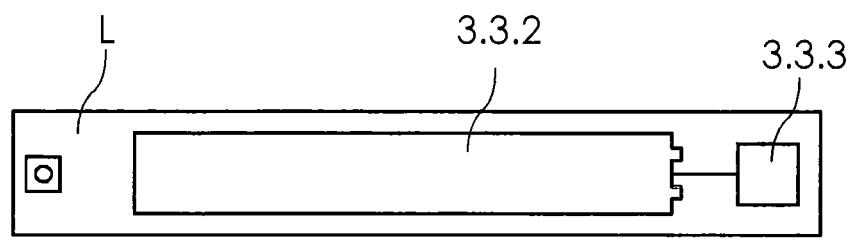

Embodiments of the invention will be explained in more detail below with reference to drawings, in which:

FIG. 1 is a block diagram showing a vehicle door comprising a door unlocking and/or door opening mechanism that has an actuating device, a door lock and a control unit, FIG. 2 is a block diagram showing a vehicle door and the actuating device in the region of an outside door handle, FIG. 3 is a block diagram showing a vehicle door and the actuating device in the region of an engagement recess, FIG. 4 schematically shows a perspective view of an actuating device for a door unlocking and/or door opening mechanism, FIG. 5 schematically shows a perspective view of a detection unit of the actuating device, and FIG. 6 schematically shows a top view of the detection unit according to FIG. 5.

Parts corresponding to each other are provided with the same reference signs in all figures.

FIG. 1 is a block diagram showing a vehicle door 1 which comprises a door unlocking and/or door opening mechanism 2.

The vehicle door 1 is part of a vehicle, not shown in detail, and is for example a vehicle side door or a vehicle tailgate. To open the vehicle door 1, said door has the door unlocking and/or door opening mechanism 2.

The door unlocking and/or door opening mechanism 2 comprises an actuating device 3, a door lock 4, in particular an electrically controllable door lock 4, and a control unit 5.

The actuating device 3 is shown and described in more detail in FIGS. 4 to 6. The actuating unit 3 is provided in particular to detect an actuation for unlocking and opening the vehicle door 1 and to transmit this to the control unit 5. In particular, the actuating device 3 transmits an opening signal s1 to the control unit 5 which, depending on this signal, transmits a control signal s2 to the door lock 4 which then unlocks so that the vehicle door 1 can be opened.

FIG. 2 is a block diagram showing a vehicle door 1 and the actuating device 3, which is arranged in the region of an outside door handle 6. For example, the actuating device 3 is arranged on an external side of the outside door handle 6 or on a side of the outside door handle 6 that faces the vehicle door 1.

FIG. 3 is a block diagram showing an alternative arrangement of the actuating device 3 in the vehicle door 1. Here, the actuating device 3 is arranged in the region of an engagement recess 7 provided in the vehicle shell of the vehicle door 1. The engagement recess 7 can be arranged in any region of the vehicle shell. For example, the engagement recess is arranged in a region of the vehicle shell of the vehicle door 1 which is opposite the outside door handle 6.

FIG. 4 shows a perspective view of the actuating device 3.

The actuating device 3 comprises an actuating element 3.1, a housing 3.2 and a detection unit 3.3.

The actuating element 3.1 is arranged for actuation outside the housing 3.2 and in a region of the vehicle door 1 that is visible to a user or at least reachable with a hand.

The actuating element 3.1 is substantially planar, the actuating element 3.1 in the embodiment shown having a cross-section that is substantially U-shaped. The side legs are formed by angled edge regions 3.1.1. The middle leg is formed by an actuating plate 3.1.2 which connects the angled edge regions 3.1.1 to one another and runs substantially parallel to an elastic housing region 3.2.1. The angled edge regions 3.1.1 of the actuating element 3.1 surround the elastic housing region 3.2.1 on the edge side. For this purpose, open ends of the angled edge regions 3.1.1 are each hook-shaped and engage interlockingly in an undercut 3.2.1.1 provided in the elastic housing region 3.2.1 on the outside, in particular on the outer edge side.

The actuating plate 3.1.2 rests on the elastic housing region 3.2.1 by means of a centrally arranged reinforcement 3.1.2.1, so that a force can be transmitted from the actuating plate 3.1.2 to the elastic housing region 3.2.1. The reinforcement 3.1.2.1 is formed by a thickening of a wall thickness of the actuating plate 3.1.2.

In regions next to the reinforcement 3.1.2.1, the actuating plate 3.1.2 is arranged at a distance from the elastic housing region 3.2.1. A reset element 3.1.3 is arranged in each of the spaces formed thereby. The reset element 3.1.3 allows the actuating element 3.1 to be reset to an initial position as shown, which corresponds in particular to a non-actuating position. The reset element 3.1.3 is, for example, a closed-pore foam, e.g. a soft foam made of polyurethane. In the embodiment shown, two reset elements 3.1.3 are arranged between the elastic housing region 3.2.1 and the actuating plate 3.1.2.

The actuating element 3.1 also has a high-quality plastics material surface, at least in the region of the actuating plate 3.1.2, in particular on a side facing away from the housing 3.2, as a result of which surface the actuating element 3.1 has mechanical stability, corrosion protection and an attractive appearance.

The housing 3.2 encloses the detection unit 3.3 and is, for example, a one-piece plastics material housing. This allows the housing 3.2 to be optimally sealed against external influences. The detection unit 3.3 arranged within the housing 3.2 is thus protected.

According to the present embodiment, the housing 3.2 comprises the elastic housing region 3.2.1 and a rigid housing region 3.2.2 that is angled with respect to said elastic housing region. Both housing regions 3.2.1, 3.2.2 form an L-shape, the rigid housing region 3.2.2 forming the leg that is vertical in the viewing direction and the elastic housing region 3.2.1 forming the leg that is horizontal in the viewing direction.

The rigid housing region 3.2.2 serves in particular to fasten the actuating device 3 in the vehicle door 1. The elastic housing region 3.2.1 serves to transmit force from the actuating plate 3.1.2 to the detection unit 3.3 and is designed to be elastic such that it has an elastic housing side 3.2.1.2 which runs parallel to the actuating plate 3.1.2.

For elastic design, this housing side 3.2.1.2 is designed, for example, so as to have a reduced wall thickness compared with other housing sides. Alternatively or additionally, the material, in particular the plastics material, can also be provided in this region with an elastic material which is either covalently integrated into the material or externally interacts with the material. Furthermore, the elastic housing side 3.2.1.2 can also consist of a material that is different from the rest of the housing 3.2, so that the housing is not made of one piece, but of two or several pieces.

The detection unit 3.3 arranged in the housing 3.2 comprises a sensor 3.3.1, a trigger element 3.3.2 and an evaluation unit 3.3.3. The sensor 3.3.1 arranged within the housing 3.2 in this case forms in particular a fixed electrode and the trigger element 3.3.2 that is likewise arranged inside the housing 3.2 forms an electrode that is movable relative to the fixed electrode. The evaluation unit 3.3.3 serves to identify an actuation of the actuating element which is inferred when a reduction in distance between the sensor 3.3.1 and the trigger element 3.3.2 is identified, and is an integral part of a printed circuit board L according to the embodiment shown in FIGS. 5 and 6, on which board the sensor 3.3.1 is also arranged, in particular fastened.

The sensor 3.3.1 is, for example, a capacitive sensor which detects a change in distance between the sensor 3.3.1 and the trigger element 3.3.2 on the basis of a change in capacitance between them. The sensor 3.3.1 and the trigger element 3.3.2 behave like an ideal plate capacitor. In particular, the sensor 3.3.1 generates a sensor signal depending on a change in capacitance, which signal is evaluated by the evaluation unit 3.3.3.

Alternatively, the sensor 3.3.1 is an inductive sensor which is based on the so-called inductance to digital converter (LDC) technology. In this case, the change in distance between the sensor 3.3.1 and the trigger element 3.3.2 is detected due to a frequency shift of a resonant circuit of the sensor 3.3.1. For example, the sensor 3.3.1 comprises an oscillator (not shown) which uses a resonant circuit to generate an alternating electromagnetic field which emerges from an active surface of the sensor 3.3.1. The signal generated by the sensor 3.3.1 depending on the detected frequency shift is converted into a digital signal, for example, and evaluated by the evaluation unit 3.3.3.

In a locked state of the door unlocking and/or door opening mechanism 2, the trigger element 3.3.2 is arranged within the housing 3.2 at a predetermined distance a from the sensor 3.3.1 and is covered by the elastic housing side 3.2.1.2. The trigger element 3.3.2 is elastically deformable and, for example, a metal sheet, in particular a sheet metal tongue or sheet metal tab. Alternatively, the trigger element 3.3.2 can also be made of a non-metal, elastically deformable material.

In addition, the trigger element 3.3.2 is fastened to the printed circuit board L at each end. For example, the trigger element 3.3.2 is screwed and/or welded and/or soldered to the printed circuit board L. The trigger element 3.3.2 thus extends substantially in a semicircle above the sensor 3.3.1, a distance between the trigger element 3.3.2 and the printed circuit board L being greatest in a center of the trigger element 3.3.2. In this region, the sensor 3.3.1 is arranged on the printed circuit board L.

The described elasticity, arrangement and fastening of the trigger element 3.3.2 allow the trigger element 3.3.2 to be deformed in the central region under the action of force, in particular when the actuating element 3.1 is actuated, in the direction of the sensor 3.3.1. The deformation of the trigger element 3.3.2 takes place in a micrometer to millimeter range, e.g. between 0.1 millimeters and 10 micrometers.

In the embodiment shown, the trigger element 3.3.2 is also connected to an electrical zero potential GND and is therefore grounded. Furthermore, the trigger element 3.3.2 is coupled to the evaluation unit 3.3.3 in an electrically switchable manner. This allows a temporally alternating evaluation of, for example, a capacitance between the trigger element 3.3.2 and the sensor 3.3.1 and an evaluation of a capacitance between the trigger element 3.3.2 and the electrical zero potential GND. The latter is used in particular to detect an approach of an object, in particular a user's hand, to the actuating element 3.1. This can be used as additional protection for a door opening request. Thus, an approach to the actuating element 3.1 and a mechanical actuation of the actuating element 3.1 can be recognized at the same time by means of the actuating device 3. An "electronic lock opening" function and a "vehicle unlocking" function can thus be carried out within the same functional area.

Alternatively, the detection unit 3.3 can also be designed such that only one actuation of the actuating element 3.1 is detected.

The actuating device 3 has a particularly compact design, whereby, due to the arrangement of the detection unit 3.3 within the housing 3.2, it is not necessary to open the housing 3.2 and the detection unit 3.3 is protected against external influences.

Alternatively, snap disk switches can also be used as the detection unit 3.3. Snap disk switches are purely mechanical and allow haptic feedback.

FIGS. 5 to 6 show the detection unit 3.3 in different views. The detection unit 3.3 is shown in FIG. 5 in a perspective view and in FIG. 6 in a top view.

An exemplary sequence of the door unlocking and/or door opening mechanism 2 is described below: A user approaches the vehicle door 1 wanting to open it. The door lock 4 of the vehicle door 1 is locked. To open the vehicle door 1, a hand of the user approaches the actuating device 3. The detection unit 3.3.1 detects the approach of the user's hand by detecting the capacitance between the trigger element 3.3.2 and the electrical zero potential GND. The user then actuates the actuating element 3.1 by applying a pressure to the actuating plate 3.1.2. This pressure is transmitted from the actuating plate 3.1.2 to the elastic housing side 3.2.1.2, which in turn transmits the pressure to the trigger element 3.3.2 by deformation. The trigger element 3.3.2 deforms in the direction of the sensor 3.3.1, which then detects a change in capacitance and generates a sensor signal and transmits it to the evaluation unit 3.3.3. The evaluation unit 3.3.3 evaluates the sensor signal and recognizes an actuation of the actuating element 3.1. The evaluation unit 3.3.3 then generates an opening signal s1 and transmits it to the control unit 5. The control unit 5 recognizes an opening wish of a user on the basis of the opening signal s1 and generates a control signal s2 which is transmitted to the door lock 4, which lock is then unlocked. The vehicle door 1 can now be opened by the user. The actuating plate 3.1.2 is moved back into its initial position by means of the reset elements 3.1.3. As a result, pressure no longer acts on the elastic housing side 3.2.1.2 or, as a consequence, on the trigger element 3.3.2, so that they are also moved back into an initial position.

LIST OF REFERENCE SIGNS

1 Vehicle door
2 Door unlocking and/or door opening mechanism
3 Actuating device
3.1 Actuating element
3.1.1 Angled edge region
3.1.2 Actuating plate
3.1.2.1 Reinforcement
3.1.3 Reset element
3.2 Housing
3.2.1 Elastic housing region
3.2.1.1 Undercut
3.2.1.2 Elastic housing side
3.2.2 Rigid housing region
3.3 Detection unit
3.3.1 Sensor
3.3.2 Trigger element
3.3.3 Evaluation unit
4 Door lock
5 Control unit
6 Outside door handle
7 Engagement recess
GND Electrical zero potential
L Printed circuit board
a Distance
s1 Opening signal
s2 Control signal

The invention claimed is:

1. A door unlocking and/or door opening mechanism comprising an actuating device, comprising:
at least one actuating element,
a housing, and
at least one detection unit comprising a sensor, a trigger element and an evaluation unit, wherein the detection unit is arranged in the housing,
wherein the actuating element is arranged for an actuation outside the housing and in a region that is accessible from the outside,
wherein the trigger element is arranged at a distance from the sensor in a locked state of the door unlocking and/or door opening mechanism,
wherein, when the actuating element is actuated in the direction of the housing and of the sensor arranged therein, the actuating element deforms the trigger element, and
wherein the sensor detects a change in a distance between the trigger element and the sensor, and
wherein the evaluation unit transmits an opening signal to the door unlocking and/or door opening mechanism when said evaluation unit identifies a reduction in distance between the trigger element and the sensor on the basis of the change in distance detected by the sensor,
wherein at least one resetting element for resetting the actuating element is arranged between the actuating element and a housing side of the housing,
wherein the actuating element and the detection unit are separated by the housing side of the housing, wherein the housing side runs parallel to the actuating element, and the housing that contains the detection unit includes the housing side is made of one piece;
wherein the at least one resetting element is a closed-pore foam.

2. The door unlocking and/or door opening mechanism according to claim 1, wherein the trigger element is designed to be elastically deformable.

3. The door unlocking and/or door opening mechanism according to claim 1, wherein the housing is made of a plastic material.

4. The door unlocking and/or door opening mechanism according to claim 1, wherein the housing side is an elastic housing side that covers the trigger element.

5. The door unlocking and/or door opening mechanism according to claim 4, wherein the actuating element comprises angled edge regions which at least partially surround the elastic housing side on an edge side.

6. The door unlocking and/or door opening mechanism according to claim 1, wherein the sensor is a capacitive sensor.

7. The door unlocking and/or door opening mechanism according to claim 6, wherein the trigger element is connected to an electrical zero potential and coupled to the evaluation unit in an electrically switchable manner.

8. The door unlocking and/or door opening mechanism according to claim 1, wherein the sensor is an inductive sensor.

9. The door unlocking and/or door opening mechanism according to claim 1, wherein the actuating element is arranged resting on the housing side.

10. The door unlocking and/or door opening mechanism according to claim 1, wherein the resetting element is arranged in a gap between the actuating element and the housing side of the housing.

11. The door unlocking and/or door opening mechanism according to claim 1, wherein the actuating element at least partially encloses and overlaps the detection unit with angled edge regions that engage beneath undercut regions of the housing.

12. The door unlocking and/or door opening mechanism according to claim 11, wherein the angled edge regions are not coplanar with a bottom surface of the housing.

13. The door unlocking and/or door opening mechanism according to claim 1, wherein the at least one resetting element is two reset elements on either side of a downwardly extending centrally arranged reinforcement of the actuating element, wherein the centrally arranged reinforcement is adapted to deflect the housing side of the housing.

14. A door unlocking and/or door opening mechanism comprising an actuating device, comprising:
- at least one actuating element,
  - a one-piece housing, and
  - at least one detection unit comprising a sensor, a trigger element and an evaluation unit, wherein the detection unit is arranged in the housing,
- wherein the actuating element is arranged for an actuation outside the housing and in a region that is accessible from the outside,
- wherein the trigger element is arranged at a distance from the sensor in a locked state of the door unlocking and/or door opening mechanism,
- wherein, when the actuating element is actuated in the direction of the housing and of the sensor arranged therein, the actuating element deforms the trigger element, and
- wherein the sensor detects a change in a distance between the trigger element and the sensor, and
- wherein the evaluation unit transmits an opening signal to the door unlocking and/or door opening mechanism when said evaluation unit identifies a reduction in distance between the trigger element and the sensor on the basis of the change in distance detected by the sensor,
- wherein the housing has an elastic housing side that covers the trigger element and the actuating element is arranged on the elastic housing side,
- wherein the elastic housing side runs parallel to the actuating element and a reset element is arranged between the actuating element and the elastic housing side of the housing;
- wherein the reset element is a closed-pore foam.

15. A door unlocking and/or door opening mechanism comprising an actuating device, comprising:
- at least one actuating element,
  - a one piece housing, and
  - at least one detection unit comprising a sensor, a trigger element and an evaluation unit, wherein the detection unit is arranged in the housing,
- wherein the actuating element is arranged for an actuation outside the housing and in a region that is accessible from the outside,
- wherein the trigger element is arranged at a distance from the sensor in a locked state of the door unlocking and/or door opening mechanism,
- wherein, when the actuating element is actuated in the direction of the housing and of the sensor arranged therein, the actuating element deforms the trigger element, and
- wherein the sensor detects a change in a distance between the trigger element and the sensor,
- wherein the evaluation unit transmits an opening signal to the door unlocking and/or door opening mechanism when said evaluation unit identifies a reduction in distance between the trigger element and the sensor on the basis of the change in distance detected by the sensor, and
- wherein a reset element is arranged between the actuating element and a housing side of the housing on either side of a centrally arranged reinforcement of an actuating plate of the actuating element,
- and wherein the actuating element and the detection unit are separated by the housing side of the housing which runs parallel to the actuating element;
- wherein the reset element is a closed-pore foam.

* * * * *